(12) United States Patent
Wursthorn

(10) Patent No.: US 7,242,738 B1
(45) Date of Patent: Jul. 10, 2007

(54) PHASE DETECTOR FOR A PHASE-LOCKED LOOP

(75) Inventor: Edgar Wursthorn, Bad Dürrheim (DE)

(73) Assignee: Thomson Licensing, Boulogne-Billancourt (FR)

( * ) Notice: Subject to any disclaimer, the term of this patent is extended or adjusted under 35 U.S.C. 154(b) by 853 days.

(21) Appl. No.: 10/049,592

(22) PCT Filed: Aug. 18, 2000

(86) PCT No.: PCT/EP00/08064

§ 371 (c)(1),
(2), (4) Date: Feb. 13, 2002

(87) PCT Pub. No.: WO01/17114

PCT Pub. Date: Mar. 8, 2001

(30) Foreign Application Priority Data

Aug. 30, 1999 (DE) .............................. 199 41 445

(51) Int. Cl.
  *H03D 3/24* (2006.01)
(52) U.S. Cl. ..................... 375/375; 375/376
(58) Field of Classification Search ............... 375/373, 375/375, 376, 327, 226, 340, 354, 355, 371; 327/3, 17, 156, 158, 145, 194, 552; 331/1 A
See application file for complete search history.

(56) References Cited

U.S. PATENT DOCUMENTS

| | | | |
|---|---|---|---|
| 5,027,085 A | | 6/1991 | Devito .................. 331/1 A |
| 5,311,178 A | | 5/1994 | Pan et al. |
| 5,452,326 A | * | 9/1995 | Tanaka ..................... 375/376 |
| 5,592,125 A | * | 1/1997 | Williams .................. 331/1 A |
| 5,778,032 A | * | 7/1998 | Tanaka et al. ............. 375/355 |
| 5,986,834 A | | 11/1999 | Colineau et al. ............ 360/51 |
| 6,118,606 A | | 9/2000 | Sasaki ....................... 360/51 |
| 6,483,871 B1 | * | 11/2002 | Dawe ........................ 375/226 |

FOREIGN PATENT DOCUMENTS

EP 0549412 6/1993

OTHER PUBLICATIONS

Patent Abstracts of Japan, vol. 1996, No. 06, Jun. 28, 1996 & JP 8-031110, published Feb. 2, 1996.

* cited by examiner

*Primary Examiner*—Khai Tran
(74) *Attorney, Agent, or Firm*—Joseph J. Laks; Robert D. Shedd; Brian J. Cromarty

(57) ABSTRACT

A phased-locked loop phase detector for digital input signals in which digital summed value for a particular number of bits is equal to zero. Sampled and digitized data comprising a delay stage for delaying the data signal by a one or more sampling clock period is supplied to the phase detector as an input signal. The delayed data signal and the undelayed data signal are then supplied to a subtraction stage. The difference between the two input values is formed in this subtraction stage. The processing stage assigns one of a plurality of possible values to the respective differential value. The full differential value range is subdivided in a number of sub-ranges corresponding to the plurality of possible values. All differential values in one sub-range are assigned the same output value. The output of the subtraction stage is supplied to a filter/control stage.

10 Claims, 3 Drawing Sheets

PHASE DETECTOR FOR A PHASE-LOCKED LOOP

This application claims the benefit, under 35 U.S.C. § 365 of International Application PCT/EP00/08064, filed Aug. 18, 2000, which was published in accordance with PCT Article 21(2) on Mar. 8, 2001 in English and which claims the benefit of German patent application No. 19941445.9 filed Aug. 30, 1999.

The invention relates to a phase detector for a phase-locked loop. In particular, the phase detector is intended to be used for a phase-locked loop which is used for recovering the data clock signal in a recorded or transmitted data signal. The recorded or received data signal implicitly contains the data clock signal and is thus self-clocking.

PRIOR ART

The invention is based on a phase detector for a phase-locked loop according to the generic type in the independent claim 1. Phase-locked loops are widely described in the prior art. As an example, reference is made to U.S. Pat. No. 5,693,376, which describes a programmable phase-locked loop which is likewise used for recovering the data clock signal when a data signal recorded on a storage medium is being read. According to the description, the storage medium relates to a hard disk or a diskette in a computer. The recorded signal is referred to in the description as an MFM signal. In this context, MFM is the abbreviation of "modified frequency modulation". In the case of magnetic data recording, the recording signals relate to so-called ternary data signals, i.e. data signals which can have the three states +1, −1 and 0. The signal read from the storage medium is initially in analogue form. After filtering and pulse amplification, this signal is supplied directly to the phase-locked loop for recovery of the data clock signal. The signal is thus in the form of an analogue signal, as before, and is also processed in analogue form in the phase detector of the phase-locked loop.

However, high-quality analogue components need to be used when producing such a phase-locked loop, since ageing- and temperature-related component variations can otherwise very easily result in corruptions in the phase control. A further disadvantage could also be that EMC radiation is more readily possible with such components if it is not prevented by complex shielding measures.

These disadvantages require that a phase-locked loop be produced in digital form. It should be able to be integrated on a chip as easily as possible but should still operate with such precision that, when a recorded or transmitted data signal is being reproduced, the sampling instant for recovering the data is placed as optimally as possible, so that optimum sampling can take place as near to the centre of the eye in the eye pattern as possible.

JP-A-8031110 discloses a solution for a digital implementation of a phase-locked loop. In this case, a recording signal read from a magnetic tape is supplied to an equalizer and is subsequently digitized in an A/D converter. The digital data signal is then passed via a delay circuit, on the one hand, and is passed on directly to a subtraction circuit, on the other hand. In the subtraction circuit, the undelayed data signal is deducted from the delayed data signal. The differential signal produced in this way is supplied to a sample-and-hold circuit. The sample-and-hold circuit is clocked with the output signal from a data pattern recognition circuit, to which the undelayed data signal is supplied. Only if a specific data pattern is recognized in this circuit is the sample-and-hold circuit clocked. The sampled value then represents a phase difference between the data clock signal and the instant of recognition of the specific data pattern. This phase difference is used to control the voltage-controlled oscillator VCO, which is used to produce the sampling frequency for the recorded data signal. Between the sample-and-hold circuit and the VCO there is additionally a loop filter, which serves to stabilize the control of the VCO. With the solution in this document, phase control is provided only with those samples which coincide with the recognition of a particular pattern in the data signal. The repetition rate of these patterns can be very low, however, so that long control times can result until the optimum clock frequency is set.

INVENTION

In the light of the solution in the document JP-A-8031110, the object of the invention is to produce an improved phase detector which can be used to improve the control response of the phase-locked loop, while at the same time taking account of the demand for as simple a circuit design as possible.

The object is achieved by the features of the independent claim 1. In accordance with the invention, the novel phase detector likewise makes use of the tried-and-tested principle of difference formation between delayed and undelayed samples. The new feature here, however, is the provision of a processing stage, in which one of a plurality of possible values is assigned to the respective differential value. These values may, in particular, be the numbers +1, −1 and 0, depending on whether the differential value, for example, is greater than, less than or equal to 0. The values assigned in this way are then supplied to a filter/control stage, at whose output the phase error can be tapped off. The phase error obtained in this way then controls the voltage-controlled oscillator in the normal way. In principle, there is not even any need for separate difference formation for the invention. All that is necessary is a comparison stage which checks whether the delayed sample is greater than, less than or equal to 0 for the undelayed sample and assigns the numbers +1, −1 and 0 accordingly.

This solution affords the advantage that a very simple phase detector is made available which is even simpler to integrate on a chip. There is no need for a further sample-and-hold circuit to be provided, and a complicated arrangement for data pattern recognition can likewise also be dispensed with. The processing stage, which assigns the permissible values to the differential values, can likewise be of simple design. In the simplest case, it comprises an arrangement for mathematical sign recognition of the differential values, and a multiplexer which outputs one of the three possible values on the basis of the mathematical sign. A further advantage of the arrangement is that any phase errors present can be corrected very quickly. Indeed, with this solution, each sample of the data signal is taken into account in the phase detector and contributes to phase control.

Further advantages of the phase detector described are also that, when the proposed digital phase detector is used, the analogue reproduction signal can be sampled with the data clock signal implicitly present in the data signal. No oversampling is necessary. The result of this is that a simple low-end, low-cost A/D converter can be used. At the same time, a condition of this is that no component needing to operate at a higher clock frequency be necessary, possibly even in the whole phase-locked loop. This considerably reduces the costs of implementation.

With the proposed digital phase detector stage, the appropriate correction of the VCO frequency always very quickly places the sampling instant for the reproduction signal at the centre of the eye opening in the eye pattern. Any noise present in the reproduction signal is quickly averaged out by the difference formation/comparison operation. In addition, the solution works largely independently of amplitude.

In the case of data dropouts, a phase-locked loop with the phase detector according to the invention has very pleasing hold properties, i.e. the frequency of the voltage-controlled oscillator remains stable since it depends only on the drift of the VCO component. The components used are very easy to produce in digital form and, apart from the VCO, to integrate on a chip.

The measures listed in the dependent claims allow further advantageous developments and improvements of the phase detector cited in claim 1.

If the recorded data signal is a ternary data signal, i.e. a data signal in which positive and negative signal components succeed one another, then it is very advantageous for the sampled and digitized data signal to pass through a rectifier stage first, for the purposes of signal conditioning. This converts the negative components of the data signal to positive components, and no problems arise with the subsequent difference formation/comparison operation.

To avoid "intersymbol interference" between adjacent signal components, it has also been found to be advantageous for positive and negative signal components in the data signal to be supplied, before rectification, to a separating stage which separates the data signal into a positive and a negative path. The two paths are then treated separately, i.e. the delay and subtraction stages and the associated processing stage for assigning data must be present for each path individually. Also, an addition stage is then necessary, in which the assigned output values from the two paths are added and, combined in this way, are passed on to the filter/control stage.

To optimize the lock-on response of the phase-locked loop in units using optical data recording (DVD, CD) even further, it has also been found that even better results are obtained with a combined solution comprising phase detection in separate paths, on the one hand, and further phase detection in a path which includes everything. In this case, the assigned output values from three different subtraction stages are combined with one another in the addition stage. This proposal stems from the fact that it has been found that the solution with only one path gave better results for many patterns in the data stream reproduced, and the solution with separate paths produced better results for other patterns. A combination of the two solutions then gives an optimized solution for such reproduction signals.

DRAWINGS

Illustrative embodiments of the invention are shown in the drawings and are explained in more detail in the description below. In the drawings.

ILLUSTRATIVE EMBODIMENTS OF THE INVENTION

The phase detector according to the invention is intended to be used in a digital implementation of a phase-locked loop. Such PLL circuits can be used in diverse areas where, for example, the data digitally recorded on a storage medium needs to be recovered or else where a transmitted data stream is received whose data likewise needs to be recovered. The recorded or transmitted data signals are very frequently self-clocking, i.e. they are coded such that enough edges arise in the data signal for it to be possible to use conventional PLL circuits to recover the data clock signal reliably. The invention is therefore also explained in more detail below using the example of this important application instance.

Figure 1:
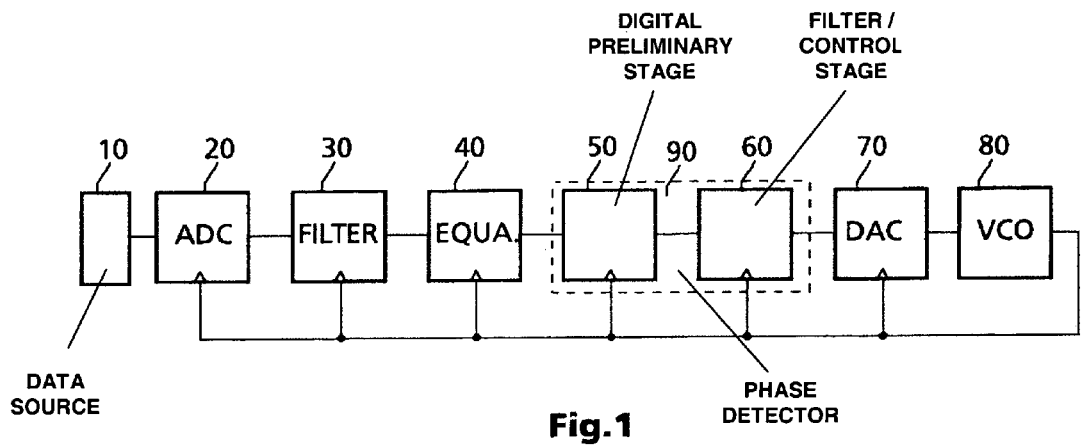
FIG. 1 shows a block diagram of a clock recovery stage with a phase-locked loop.

In FIG. 1, the reference numeral 10 denotes a data source. Known data recording units are, by way of example, digital video recorders based on the D-VHS standard, DVC units, DVD units, CD units, MD units etc. Examples of units which receive digitally transmitted data are DVB receivers or DAB receivers. The reference numeral 20 indicates an A/D converter. This converts the read or received signal into digital form. The signal profile then encounters a filter stage 30. This carries out signal conditioning. This can be done, by way of example, using a digital high-pass filter which has feedback and places the decision window or the decision threshold for the signal onto the zero axis of the signal (the samples are digital zero there). Such a filter stage is known from the prior art. As an example, reference is made to the DVD standard, which likewise describes such a component.

Next comes an equalizer unit having the reference numeral 40. The equalizer unit shown is a digital unit. However, the equalizer need not necessarily be arranged at this point. Alternatively, an analogue equalizer could also be used, but this would then need to be arranged before the A/D converter 20. Adjacent to this is a digital preliminary stage 50 for phase error determination. This unit will be explained in more detail below. Connected downstream of the preliminary stage 50 is a filter/control stage 60. For the clock recovery application described here, a PI control stage (Proportional Integral) has been found to be advantageous. Such PI control stages are likewise known from the prior art. In the illustrative embodiment described here, the PI control stage is provided in digital form. In another illustrative embodiment, an analogue form of the PI control stage could be used as an alternative.

In the following text, the filter/control stage 60 is perceived as being a necessary component of the phase detector 90, since it has been found that the output values generated in the preliminary stage 50 are not suitable, in unconditioned form, for readjusting the VCO and would only impair the control response of the phase-locked loop. This unity of the preliminary stage and filter/control stage is emphasized by the section-lined border. The output signal from the filter/control stage 60 is then converted into an analogue signal in a D/A converter 70, and said analogue signal is then applied to the control input of a downstream-connected voltage-controlled oscillator 80. The VCO 80 produces the data clock signal directly. The data clock signal produced in this way is supplied to the A/D converter 20. This is possible because the invention's phase detector for determining the phase error does not require any oversampling. All other listed components 30 to 70 can also be supplied with the same clock signal. However, if these components are not designed to operate with this clock signal, another clock signal can be supplied to them, particularly at a higher clock frequency.

The design and operation of the digital preliminary stage 50 is explained in more detail below. Its design is shown in the block diagram in the left-hand part of FIG. 2. The signal coming from the equalizer 40 is first rectified in a rectifier 51. The rectified signal is then supplied to a delay stage 52. The delay stage 52 delays the data signal by one sampling clock period. The delayed signal is supplied to a b input of a subtraction stage 53. The input of the subtraction stage 53 is supplied with the undelayed data signal. In the subtraction stage 53, the delayed sample at the b input is deducted from the undelayed, current sample at the input. The resulting differential value is then analysed in a processing stage 54. In the simplest case, the processing stage 54 assigns one of three possible output values to the differential value. Specifically, in the simplest case, these are the output values +1, 0, −1. In this context, assignment proceeds as follows: it comprises a simple mathematical sign check. If the differential value is greater than 0, then the value +1 is assigned to it. If the differential value is 0 within the bounds of computational accuracy, then the value 0 is assigned to the differential value. If the differential value is less than 0, then the value −1 is assigned to it as output value.

In a departure from this embodiment of the processing stage 54, it can also be designed such that it contains particular defined bands within which associated values are assigned. As an example, a band for assigning the value 0 may also be provided, which is then situated symmetrically about the zero point of the differential value axis. A further refinement may be that more than three values are assigned, e.g. 5, 7, 9 etc. An associated band range then needs to be provided for each individual value. If the differential value is in the associated band, the appropriate output value is assigned.

In another alternative embodiment, instead of a separate subtraction stage 53 and processing stage 54, a comparison stage is provided which compares the delayed sample with the undelayed sample directly and, depending on the comparison result, assigns greater than, less than and equal to the corresponding value. The two embodiments are regarded as being equivalent.

The assigned value is the output value from the phase preliminary stage 50 and is passed on to the filter/control stage 60. The phase error is determined only after a plurality of successive output values from the phase preliminary stage 50 have been combined and analysed.

Figure 2:
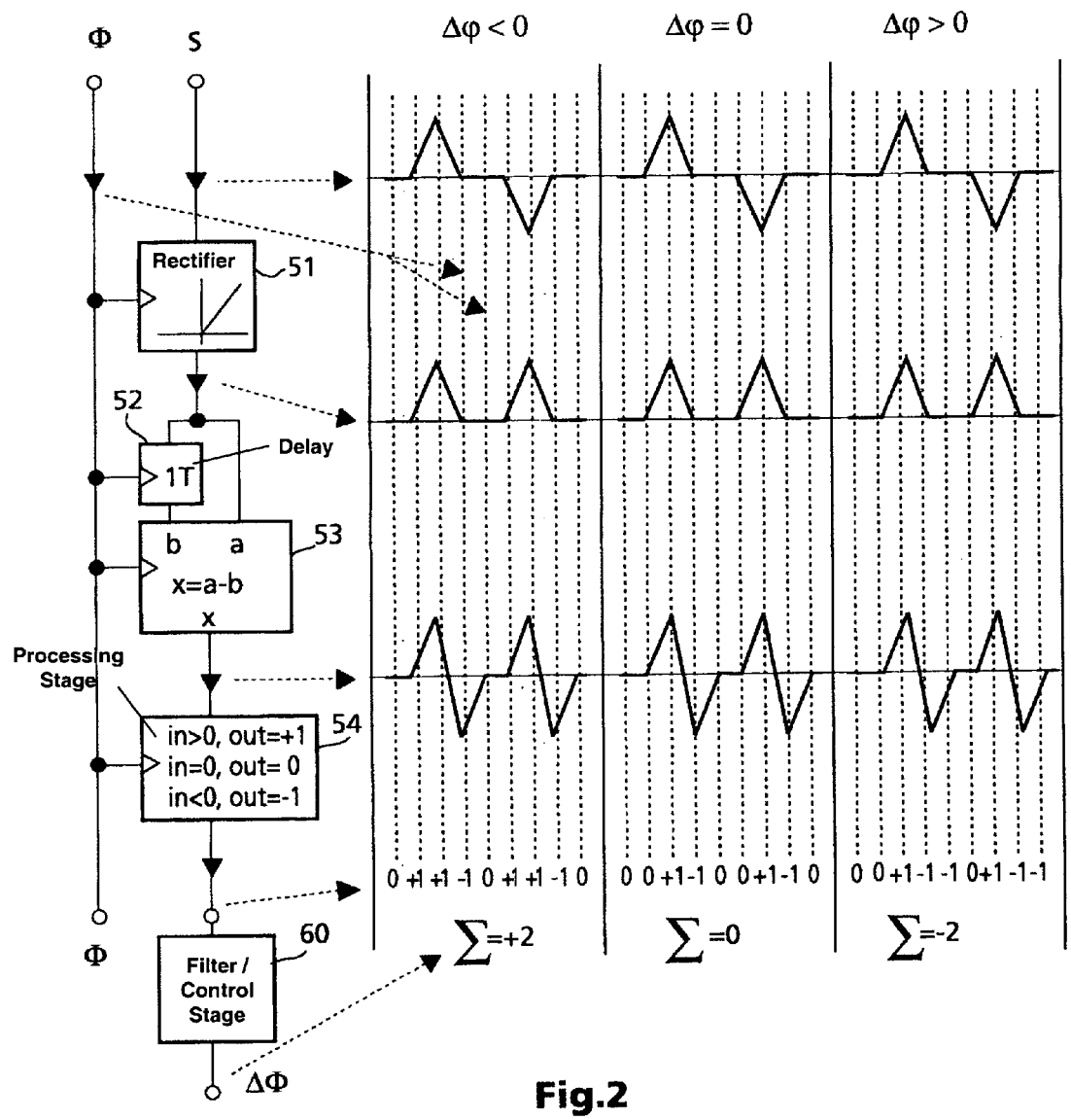
FIG. 2 shows a block diagram of the phase detector according to the invention and associated signal profiles.

This is illustrated below with the aid of the signal profiles in the right-hand part of FIG. 2. The signal profile for the digitized input signal is shown in the top part of FIG. 2. The succession of a positive 1T pulse (distinguished by the three successive values 0, +1, 0) and of a negative 1T pulse (distinguished by the three successive values 0, −1, 0) is shown for three different cases. Dashed, vertical lines mark the sampling points for the signal. The central part of the figure shows a situation in which the sampling instant occurs in optimum fashion at the maximum and minimum of the signal profile being considered. The left-hand part of the figure shows a situation in which the sampling is carried out with incorrect phase; in the case illustrated, the sampling point is shifted to the left as compared with sampling in the eye centre. The right-hand part of FIG. 2 likewise shows phase-shifted sampling, this reflecting a situation in which the sampling takes place to the right of the eye centre. The signal profile after rectification in the rectifier 51 is shown in the central part of FIG. 2. Rectification likewise turns the negative signal components into positive signal components. This doubles the number of positive pulses. The output signal after the difference has been formed in the subtraction stage 53 is shown in the bottom signal graph in FIG. 2. The formation of the difference between the delayed sample and the undelayed sample means that, for each positive pulse, an alternating pulse is produced which contains both positive and negative components. It would not yet be possible to use simple summing of these differential values at the sampling instants for optimum determination of phase error, because the values would cancel each other out in terms of magnitude. This can also be seen from the signal profiles in the left-hand and right-hand parts of FIG. 2. Although, for example in the case of sampling to the left of the eye centre, there is only one differential value in the negative range, this value, when regarded in absolute terms, is larger than the individual positive differential values at the sampling instants beforehand. On average, it would thus not be possible to read off an unambiguous phase error.

The invention's assignment of output values to the differential values in the processing stage 54 changes this situation. This is because, in line with the preceding description of the assignment in the processing stage 54, the output value +1 is assigned indiscriminately to each positive sample, and the output value −1 is assigned indiscriminately to each negative sample. The sequence of these assigned values is shown in the bottom portion of FIG. 2. It can clearly be seen that merely when 9 successive samples are summed, the value +2 is output as the resulting sum. This applies for the aforementioned case of sampling to the left of the eye centre. With correct-phase sampling in the eye centre, however, the resulting value produced is the value 0, and, in the case of the illustration in the right-hand part of the signal graph for sampling to the right of the eye centre, the resulting value produced is the output value −2. The summation of the values output in this way is thus a measure of the phase error which is present during sampling. For the invention, it is thus sufficient for the filter/control stage 60 to comprise, in the simplest case, a counting arrangement controlled by the output values from the processing stage 54. In this case, control involves the counter being incremented when the value +1 is output as the output value, being decremented when the value −1 is output as the output value and being held when the value 0 is output as the output value. On the other hand, this is also equivalent to simple addition of the output values. After a prescribed interval (in this case 9 samples, for example), the value in the counter is then evaluated and used for readjusting the VCO. As already shown in FIG. 1 previously, the filter/control stage 60 may also be designed as a PI controller. This has likewise been found to be advantageous for the control response of the PLL.

Figure 3:
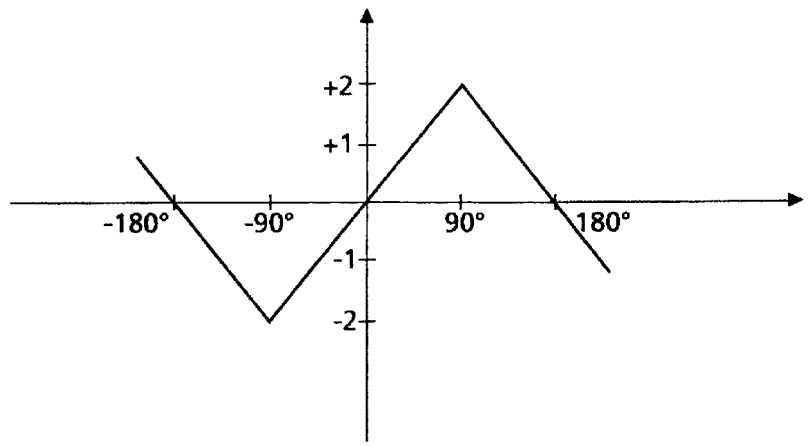
FIG. 3 shows the transfer function of the phase detector shown in FIG. 2.

The transfer function of the described phase detector for the example shown is illustrated in FIG. 3. A phase difference of +90° is present if summing the nine assigned values results in the value +2. A phase shift of −90° is present if summing the nine assigned values results in the value −2. Correct-phase sampling is taking place if summing as described above gives the value 0.

Figure 4:
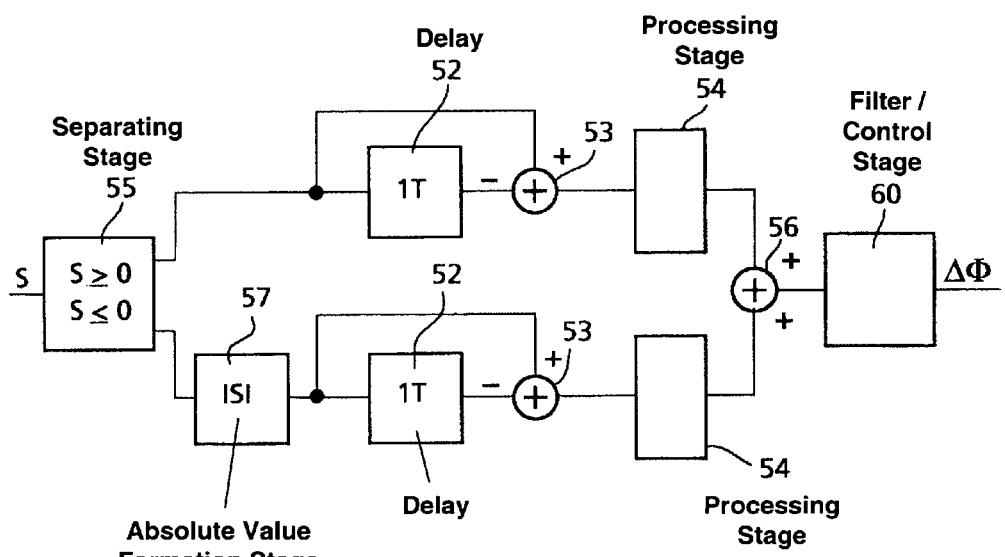
FIG. 4 shows a block diagram of a second illustrative embodiment of a phase detector according to the invention.

An alternative embodiment for the phase detector 90 is shown in FIG. 4. In this figure, the same reference numerals denote the same components as in FIG. 2. The difference is that the components 52–54 in the alternative embodiment are present twice. In addition, there is also a separating stage 55, in which the data signal is split into a positive path and a negative path. In this separating stage 55, all the samples greater than or equal to 0 are passed to the positive path and all the samples less than or equal to 0 are passed to the negative path, accordingly. In addition, there is also an absolute value formation stage 57 provided in the negative path. This merely erases the negative mathematical sign of the samples present in the negative path. After that, there are then likewise only positive values available. The result of this arrangement is that the positive and negative pulses are treated in separate delay and subtraction stages. The values output by the processing stages 54 are subsequently combined, that is to say added, in an addition stage 56. This means that there is ultimately roughly the same response as for the sequence of values shown in FIG. 2. However, it must be taken into account that, in FIG. 2, the positive and negative pulses are separated from one another by two sampling periods. In the case of a real-recorded data signal, this is not always ensured, which can then result in corruptions if two pulses are very close to one another. In such cases, the alternative solution shown in FIG. 4 is advantageous.

Figure 5:
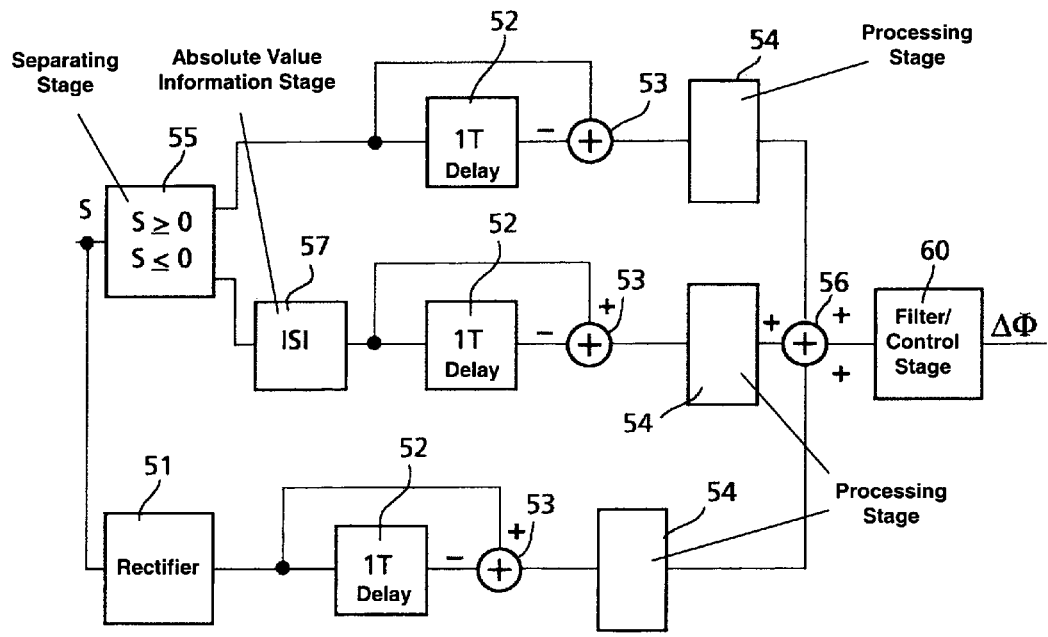
FIG. 5 shows a block diagram of a third illustrative embodiment of a phase detector according to the invention.

A further alternative refinement of a phase detector 90 is also shown in FIG. 5. In this figure too, the same components are denoted by the same reference numerals. The embodiment in this figure is practically equivalent to a combination of the two previously explained embodiments for the phase detector 90. In addition to a processing path in which the positive and negative paths of the input data signal are processed separately, there is also a third path, in which the positive and negative paths are again combined and processed, as in the first embodiment. The results of all three paths are then again combined with one another in the addition stage 56. Experiments have shown that this solution is advantageous particularly for the signals read from optical recording media, such as CD and DVD. This is related to the run length of such read signals, which is equivalent to a minimum of 3 clock periods for optically scanned storage media.

The conversion of the values output by the filter/control stage 60 into analogue signals by means of the D/A converter 70 is not absolutely essential. As an alternative to this, it is also possible to provide a pulse-width-modulation stage which converts the digital signal into a pulse-width-modulated digital signal, which is then integrated in a downstream-connected filter stage and is used for adjusting the frequency.

A prerequisite for the viability of the solutions described is that the digital summed value of the input signal for a particular number of bits, e.g. for 1000 bits, is equivalent to the value 0. This is the case for signals recorded on magnetic storage media, for example, and likewise for optically recorded signals as well.

The invention claimed is:

1. A Phase detector for a phase-locked loop for digital input signals in which the digital summed value for a particular number of bits is equivalent to zero, said phase detector having a plurality of sampled and digitized digital sample value being supplied to said phase detector, comprising a delay stage for delaying the digital sample values by one or more sampling clock periods, a subtraction stage, to which the undelayed and the delayed digital sample values are supplied to produce a differential value, and a filter or control stage, to which the output of the subtraction stage is supplied at the output of the filter or control stage which a phase error can be tapped off, characterized in that a processing stage is provided, located between the subtraction stage and the filter or control stage, which assigns one of a plurality of possible output values, to the differential value, wherein a full differential value range is subdivided in a number of sub-ranges corresponding to the plurality of possible output values, so that each differential value falling within one of the sub-ranges will get a same output value assigned.

2. The phase detector according to claim 1, wherein the subtraction stage is integrated in a comparison stage which compares the delayed sample with said undelayed sample and assigns said one of a plurality of output values to the differential value.

3. The phase detector according to claim 1, wherein said filter or control stage is a Proportional Integral (PI) controller.

4. The phase detector according to claim 1, in which the delayed digital sample is deducted from the undelayed digital sample in the subtraction stage.

5. The phase detector according to claim 1, in which a rectifier for signal conditioning is provided which has the sampled and digitized data signal supplied to it, the sampled and digitized data signal being a ternary data signal, in particular.

6. The phase detector according to claim 5, in which the unrectified sampled and digitized ternary data signal is supplied to a separating stage in which the sampled and digitized data signal is separated into a positive and a negative path.

7. The phase detector according to claim 6, in which separate delay, subtraction and processing stages or delay and comparison stages are provided for each path, and in which an addition stage is provided in which the assigned output values from one of either processing or comparison stages are added and, combined in this way, are passed on to the filter or control stage.

8. The phase detector according to claim 7, in which, in addition to the separate delay, subtraction and processing stages or delay and comparison stages for the positive and the negative path, there are also separate delay, subtraction and processing stages or delay and comparison stages for a further path, in which the unrectified sampled and digitized ternary data signal is processed, the output values assigned by the processing stages or comparison stages of the further path likewise being supplied to the addition stage.

9. The phase detector according to claim 1, wherein the phase detector is integrated in a phase-locked loop circuit for recovering the data clock signal for a sampled and digitized data signal.

10. The phase detector according to claim 9, wherein the data signal delayed by one or more sampling clock periods corresponds to the data clock signal in the sampled and digitized data signal.

* * * * *